United States Patent
Mukherjee et al.

(10) Patent No.: US 8,117,249 B1
(45) Date of Patent: *Feb. 14, 2012

(54) EQUALIZER SYSTEMS AND METHODS UTILIZING ANALOG DELAY ELEMENTS

(75) Inventors: Debanjan Mukherjee, San Jose, CA (US); Jishnu Bhattacharjee, San Jose, CA (US); Qian Yu, Cupertino, CA (US); Abhijit Phanse, Sunnyvale, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 1128 days.

This patent is subject to a terminal disclaimer.

(21) Appl. No.: 11/926,869

(22) Filed: Oct. 29, 2007

Related U.S. Application Data

(62) Division of application No. 10/724,443, filed on Nov. 26, 2003, now Pat. No. 7,302,461.

(51) Int. Cl.
*G06F 17/10* (2006.01)

(52) U.S. Cl. .......... 708/323; 708/819; 375/232

(58) Field of Classification Search .......... 708/322, 708/323, 819; 375/232
See application file for complete search history.

(56) References Cited

U.S. PATENT DOCUMENTS

| | | | |
|---|---|---|---|
| 3,786,283 A | 1/1974 | Iida | |
| 5,051,629 A | 9/1991 | Hopkins | |
| 5,146,192 A | 9/1992 | Kondo et al. | |
| 5,318,034 A | 6/1994 | Ishida et al. | |
| 6,011,813 A * | 1/2000 | Ghosh | 375/233 |
| 6,563,841 B1 * | 5/2003 | Nedic et al. | 370/480 |
| 7,016,406 B1 * | 3/2006 | Phanse et al. | 375/232 |
| 7,046,726 B2 * | 5/2006 | Jayaraman et al. | 375/233 |
| 7,339,988 B1 * | 3/2008 | Shanbhag et al. | 375/232 |
| 2003/0035474 A1 * | 2/2003 | Gorecki et al. | 375/229 |

* cited by examiner

*Primary Examiner* — Chuong D Ngo

(74) *Attorney, Agent, or Firm* — Haynes and Boone, LLP

(57) ABSTRACT

Systems and methods provide analog delay elements, which may be utilized in isolation or in a cascade, such as for use within equalizers or other types of applications. For example, a delay element may include a broadband amplifier and a passive, programmable filter, which may provide a desired magnitude and group delay response over a wide frequency range while being tolerant of process variations. An equalizer, for example, may include the delay element within its feed forward filter and/or within its other circuits, such as within its adaptive coefficient generator or slicer input time-align circuit.

20 Claims, 4 Drawing Sheets

EQUALIZER SYSTEMS AND METHODS UTILIZING ANALOG DELAY ELEMENTS

CROSS-REFERENCE TO RELATED APPLICATIONS

This divisional patent application claims priority to U.S. patent application Ser. No. 10/724,443, filed Nov. 26, 2003, now U.S. Pat. No. 7,302,461 and issued Nov. 27, 2007, which is incorporated herein by reference in its entirety.

TECHNICAL FIELD

The present invention relates generally to electrical circuits and, more particularly, to analog delay elements.

BACKGROUND

Delay elements are well known and employed in a variety of circuit applications. For example, a circuit known as a Gm-C (transconductance or transconductance-capacitance) filter may be utilized as a delay element. However, one drawback of the Gm-C filter is that its operation is generally limited in speed (e.g., less than 900 MHz) and, therefore, has limited applicability to high-bandwidth, multi-gigahertz systems.

Another example of a delay element is a transmission line. However, transmission line based delay elements may have a number of drawbacks, such as area inefficiency, dependence on accurate electromagnetic modeling, and significant power consumption. As a result, there is a need for improved delay element techniques.

SUMMARY

Systems and methods are disclosed herein to provide delay elements. For example, in accordance with an embodiment of the present invention, a delay element is disclosed that may be utilized in isolation or in a cascade. The delay element may include a broadband amplifier and a passive, programmable filter. Furthermore, the delay element may provide an approximately flat magnitude and group delay response over a wide frequency range while being tolerant of process variations. Thus as an example, one or more delay elements may be used within an equalizer or within other types of applications.

More specifically, in accordance with an embodiment of the present invention, an equalizer includes a feedforward filter adapted to receive a first input signal and provide a first output signal, wherein the feedforward filter comprises at least one delay element having a variable delay; an adaptive coefficient generator adapted to receive the first input signal and a second signal and provide tap coefficients to the feedforward filter; a slicer adapted to receive a slicer input signal and provide a slicer output signal; a slicer timing alignment block adapted to receive the slicer input signal and provide a second output signal, wherein the slicer output signal is subtracted from the second output signal to generate an error signal; a tap timing alignment block adapted to receive the slicer output signal and provide a third output signal; and a first low pass filter adapted to receive the third output signal and the error signal and provide a fourth output signal, wherein the fourth output signal is multiplied with the third output signal to provide a feedback signal which is added to the first output signal to generate the slicer input signal.

In accordance with another embodiment of the present invention, an equalizer includes means for filtering a first input signal to provide a first output signal, wherein the filtering means includes at least one delay element having a variable delay; means for providing tap coefficients to the filtering means, wherein the providing means receives the first input signal and an error signal; means for providing a slicer output signal based on the first output signal and a feedback signal; means for providing a slicer input time-align output signal based on the first output signal and the feedback signal, wherein the slicer output signal is subtracted from the slicer time-align output signal to provide the error signal; means for providing a slicer output time-align output signal based on the slicer output signal and the error signal; and means for providing the feedback signal based on the slicer output time-align output signal and the error signal.

In accordance with another embodiment of the present invention, a method of equalizing a signal includes filtering a first input signal to provide a first output signal, wherein the filtering uses at least one delay element comprising inductors and cross-coupled capacitors whose capacitance is variable to provide a variable delay; providing tap coefficients to the filtering, wherein the providing receives the first input signal and an error signal; providing a slicer output signal based on the first output signal and a feedback signal; providing a slicer input time-align output signal based on the first output signal and the feedback signal, wherein the slicer output signal is subtracted from the slicer time-align output signal to provide the error signal; providing a slicer output time-align output signal based on the slicer output signal and the error signal; and providing the feedback signal based on the slicer output time-align output signal and the error signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
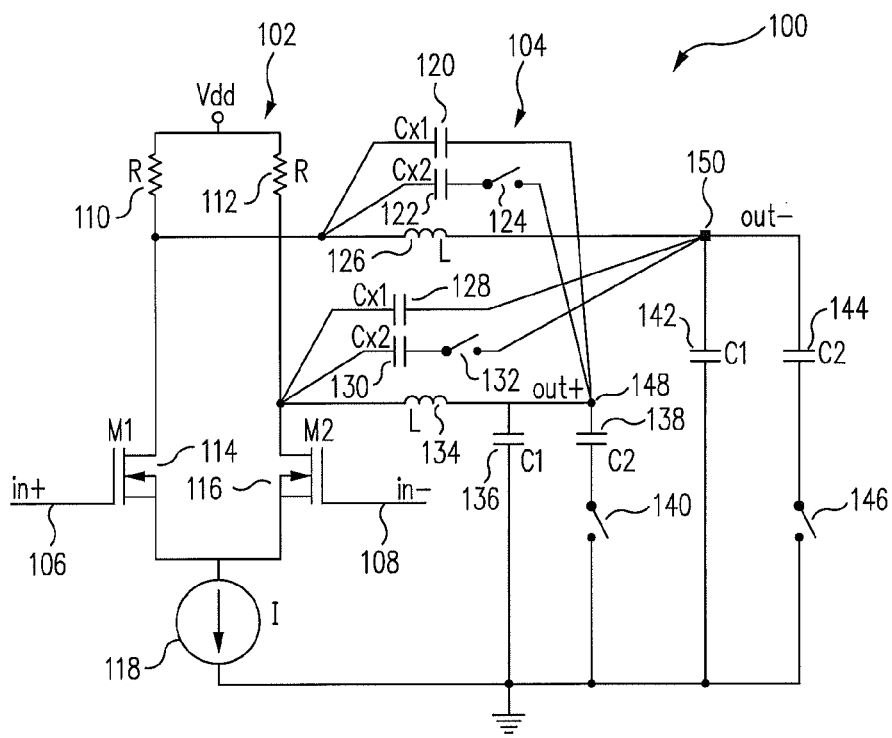
FIG. 1 shows a circuit diagram illustrating a delay element in accordance with an embodiment of the present invention.

FIG. 1 shows a circuit diagram illustrating a delay element 100 in accordance with an embodiment of the present invention. Delay element 100 includes an amplifier 102 and a filter 104. Amplifier 102 is a broadband differential amplifier having resistors 110 and 112 (each labeled R), transistors 114 and 116, and a current source 118. Amplifier 102 receives input signals via input terminals (in +, in−) 106 and 108 and provides output signals via filter 104 at output terminals (out+, out−) 148 and 150.

Filter 104 is a passive inductor-capacitor (LC) filter having inductors 126 and 134, capacitors 120, 122, 128, 130, 136, 138, 142, and 144, and switches 124, 132, 140, and 146. Capacitors 120 and 122 and capacitors 128 and 130 provide cross-coupled switchable capacitors, with capacitors 122 and 130 selectively enabled by closing corresponding switches 124 and 132 (e.g., transistors). Thus, capacitors 120 and 128 are fixed cross-coupled capacitors, while capacitors 122 and 130 are switchable cross-coupled capacitors.

Capacitors 122 and 130 may be selectively included, for example, to compensate for semiconductor processing (process) variations. It should be understood that the number of switchable cross-coupled capacitors (i.e., capacitors 122 and 130) may vary, depending upon the desired application and expected process variations (e.g., provide design robustness across process variations). For example, additional switchable cross-coupled capacitors, in addition to and in parallel and/or in series with capacitor 122 and capacitor 130 may be included to provide additional selectable capacitance or provide smaller selectable capacitance value increments. In general, capacitors 120, 122, 128, and 130 provide one or more right-half plane zeros, which may increase bandwidth and provide a desired delay.

Capacitors 136 and 138 and capacitors 142 and 144 provide switchable load capacitors, with capacitors 138 and 144 selectively enabled by closing corresponding switches 140 and 146. Thus, capacitors 136 and 142 are fixed load capacitors, while capacitors 138 and 144 are switchable load capacitors to provide programmability of delay element 100.

Delay element 100 may be utilized as a programmable delay element, for example, by selectively enabling the load capacitors. This may be an important feature for delay elements employed, for example, within rate-agile analog continuous time equalizers, which are discussed further herein. As an example, the switchable load capacitors may be selected so that the delay element provides a delay that is a fixed fraction (e.g., <1) of a symbol period across different data rates.

It should be understood that the number of switchable load capacitors (i.e., capacitors 138 and 144) may vary, depending upon the desired application and expected process variations. For example, additional switchable load capacitors, in addition to and in parallel with capacitor 138 or capacitor 144 may be included to provide additional selectable capacitance or provide smaller selectable capacitance value increments.

Figure 2:
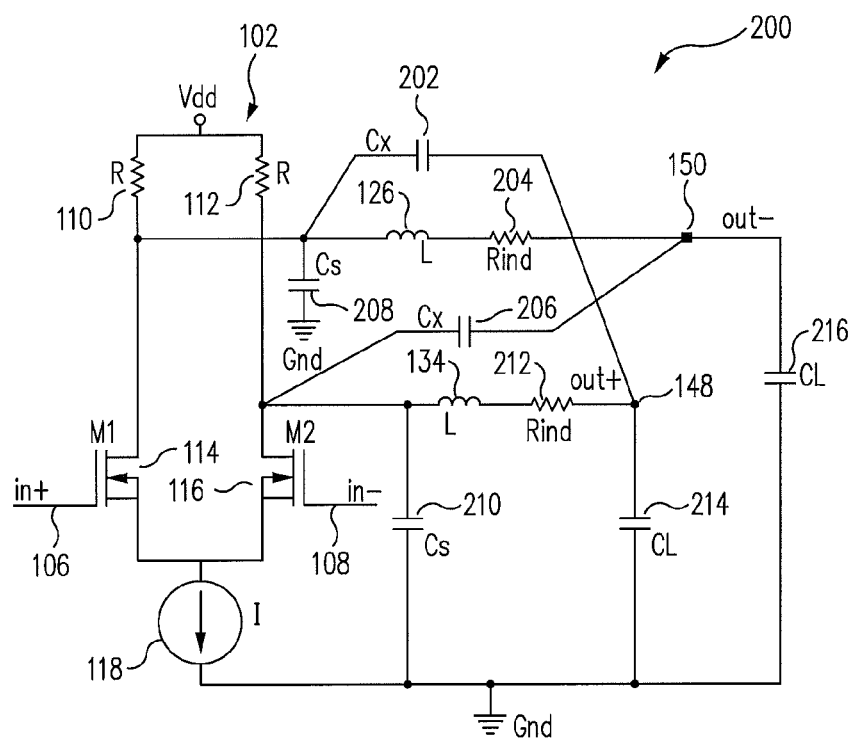
FIG. 2 shows a circuit diagram illustrating a delay element in accordance with an embodiment of the present invention.

FIG. 2 shows a circuit diagram illustrating a delay element 200 in accordance with an embodiment of the present invention. Delay element 200 is similar to delay element 100 and may be viewed as an exemplary implementation of delay element 100 and, therefore, the description of similar features will not be repeated.

Delay element 200 includes cross-coupled capacitors 202 and 206 (each labeled $C_x$), which may represent capacitors 120 and 122 and capacitors 128 and 130, respectively, and load capacitors 214 and 216 (each labeled $C_L$), which may represent capacitors 136 and 138 and capacitors 142 and 144, respectively. Capacitors 214 and 216 may also represent capacitance associated with the following stage (e.g., if in a cascaded configuration with other delay elements), inductor parasitic capacitance associated with inductors 126 and 134, and metal routing capacitance.

Capacitors 208 and 210 (each labeled $C_s$) represent capacitance associated at a terminal (e.g., a drain terminal) of corresponding transistors 114 and 116 of amplifier 102 and may include amplifier drain capacitance, inductor parasitic capacitance, and metal routing capacitance. Resistors 204 and 212 (each labeled $R_{ind}$) represent a resistance associated with corresponding inductors 126 and 134 (each labeled L).

An exemplary transfer function ($H_{norm}(s)$) of delay element 200 is shown below, with the transfer function normalized to a direct current (DC) gain.

$$H_{norm}(s) = \frac{out_+(s) - out_-(s)}{in_+(s) - in_-(s)} = \frac{1 + a_1 s + a_2 s^2}{1 + b_1 s + b_2 s^2 + b_3 s^3}$$

$a_1 = -R_{ind}C_x$, $a_2 = -LC_x$ $b_1 = 2R(2C_x + C_s + C_L) + R_{ind}(C_x + 2C_L)$, $b_2 = L(C_x + 2C_L) + RR_{ind}(C_xC_L + C_xC_s + 2C_sC_L)$, $b_3 = 2LR(C_xC_L + C_xC_s + 2C_sC_L)$ Delay element 100 (or delay element 200) may be implemented as a process-insensitive, wide-bandwidth (e.g., multi-gigahertz or broadband) analog delay element. By utilizing a high-speed broadband amplifier followed by a passive filter, for example, the fully-differential circuit may reject any input common-mode signals and may provide a constant group delay for a differential input signal. Furthermore, the switchable (cross-coupled and load) capacitor structure may function to provide an optimally flat magnitude and group delay response across a desired frequency range (e.g., provide pulse fidelity) despite process variations.

For broadband circuits, a delay element should have a constant group delay and magnitude response over a desired frequency band of an input signal to maintain optimal pulse fidelity. A number of delay elements 100, for example, may be employed as quasi-distributed circuit elements which utilize complex, left-half plane poles and right-half plane zeros to provide greater delay and wider bandwidth. Delay element 100 provides programmability (i.e., programmable delay element) via selectable cross-coupled capacitors and load capacitors.

Figure 3:
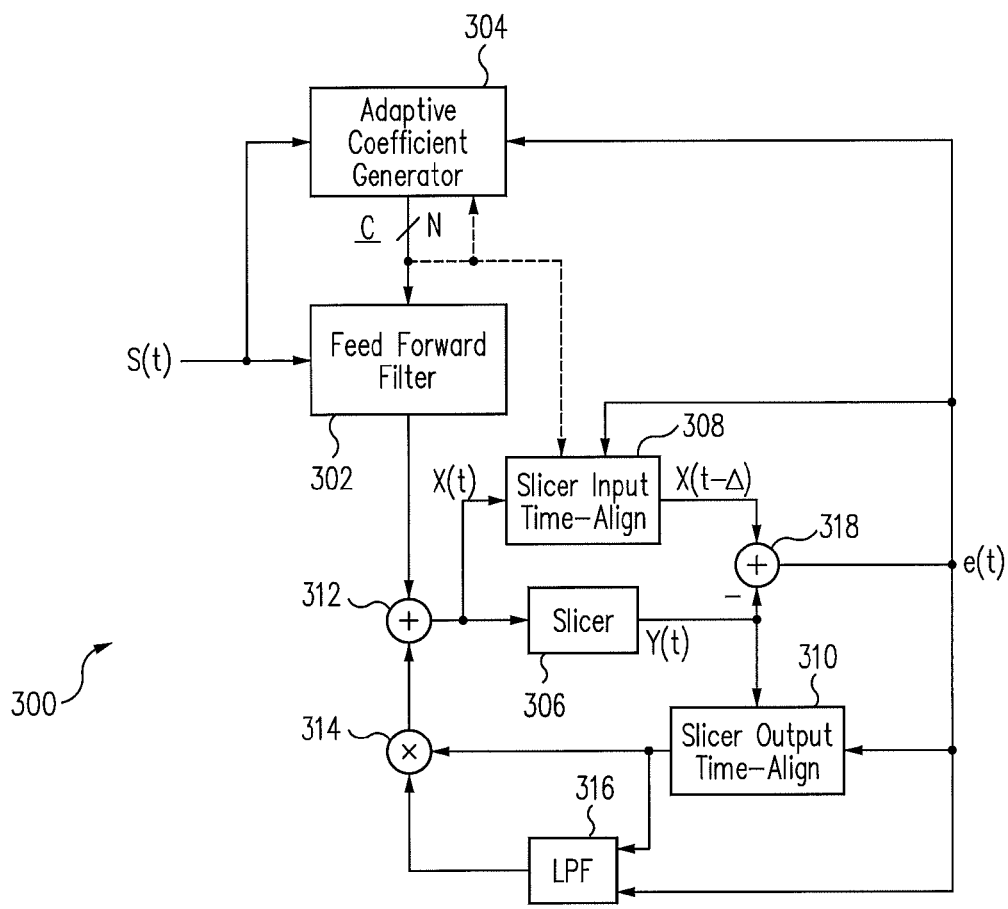
FIG. 3 shows an exemplary application for one or more delay elements in accordance with an embodiment of the present invention.

Delay element 100 may be utilized, for example, within analog continuous-time filters or to provide the desired delay element structures for rate-agile, multi-gigahertz, continuous-time equalizers. As an exemplary implementation for one or more delay elements (e.g., delay elements 100 and/or 200), FIG. 3 illustrates a continuous-time least mean square (LMS) based adaptive equalizer 300. LMS-based equalizer 300 includes a feedforward filter 302, an adaptive coefficient generator 304, an output signal slicer 306, a slicer input time-align circuit 308, and a slicer output time-align circuit 310. Feedforward filter 302 receives an input data signal s(t) and tap coefficients from adaptive coefficient generator 304 and generates an equalized signal, which is input to an adder 312. The other input to adder 312 is the product 314 of the output of an integrator, such as a low pass filter block 316, and slicer output time-align circuit 310. Low pass filter block 316, for example, may represent a multiplier followed by a low pass filter.

The feedback signal (from product 314) into adder 312 provides an iterative correction to an error signal e(t) used by adaptive coefficient generator 304 to generate adaptive tap coefficients. The error signal, processed through adder 318, is the difference between the outputs of slice input time-align circuit 308 and slicer 306, x(t−Δ) and y(t), respectively. As time passes, the error signal converges until a sufficiently small error signal is obtained through adaptively changing the tap coefficients.

Figure 4:
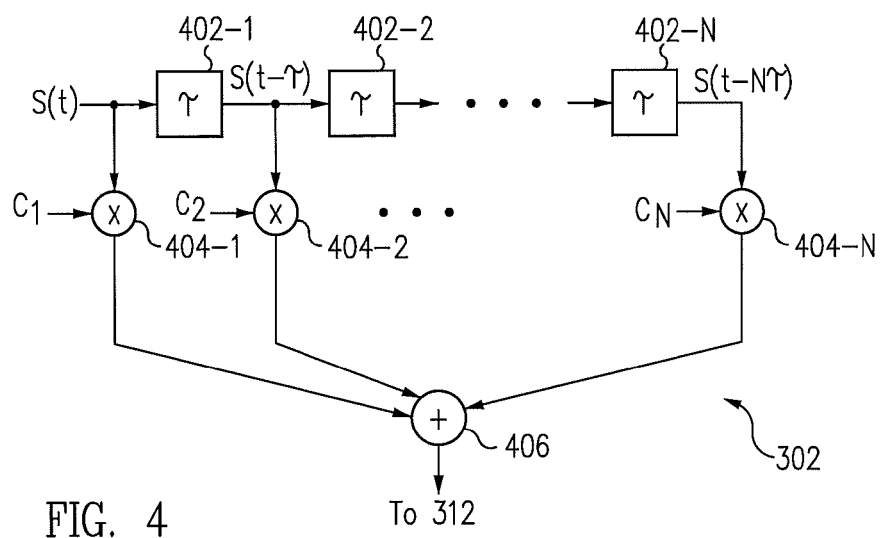
FIG. 4 shows an exemplary implementation of a portion of the application of FIG. 1.

FIG. 4 shows an exemplary implementation of a feedforward filter suitable for use as feedforward filter 302 of FIG. 1. The feedforward filter includes a series of signal delay elements 402-1 to 402-N. Each delay element 402 delays the incoming signal by a fixed amount τ, e.g., s(t−τ), s(t−2τ), . . . s(t−Nτ). The delay τ is typically selected to be less than a symbol period, and in one embodiment, about half a symbol period to achieve good performance at low SNR.

The input data signal s(t) and each successive delayed signal from delay elements 402-1 to 402-N are multiplied by corresponding multipliers 404-1 to 404-N with its respective adaptive coefficient signals from adaptive coefficient generator 304. The product signals are then summed by an adder circuit 406 to form the equalized signal. Further details may be found in U.S. patent application Ser. No. 10/614,587, entitled "Channel Monitoring and Identification and Performance Monitoring in a Flexible High Speed Signal Processor Engine" and filed Jul. 3, 2003, now U.S. Pat. No. 7,339,988 and issued Mar. 4, 2008, which is incorporated herein by reference in its entirety.

Delay element 100 (or delay element 200), in accordance with an embodiment of the present invention, may represent an exemplary circuit implementation for each delay element 402 (e.g., delay element 402-1) of FIG. 4. Furthermore, delay element 100 may be employed as one or more of the delay elements which may be desired, for example, in circuit implementations for adaptive coefficient generator 304 and slicer input time-align circuit 308 (which are described in further detail in U.S. patent application Ser. No. 10/614,587, now U.S. Pat. No. 7,339,988).

Figure 5:
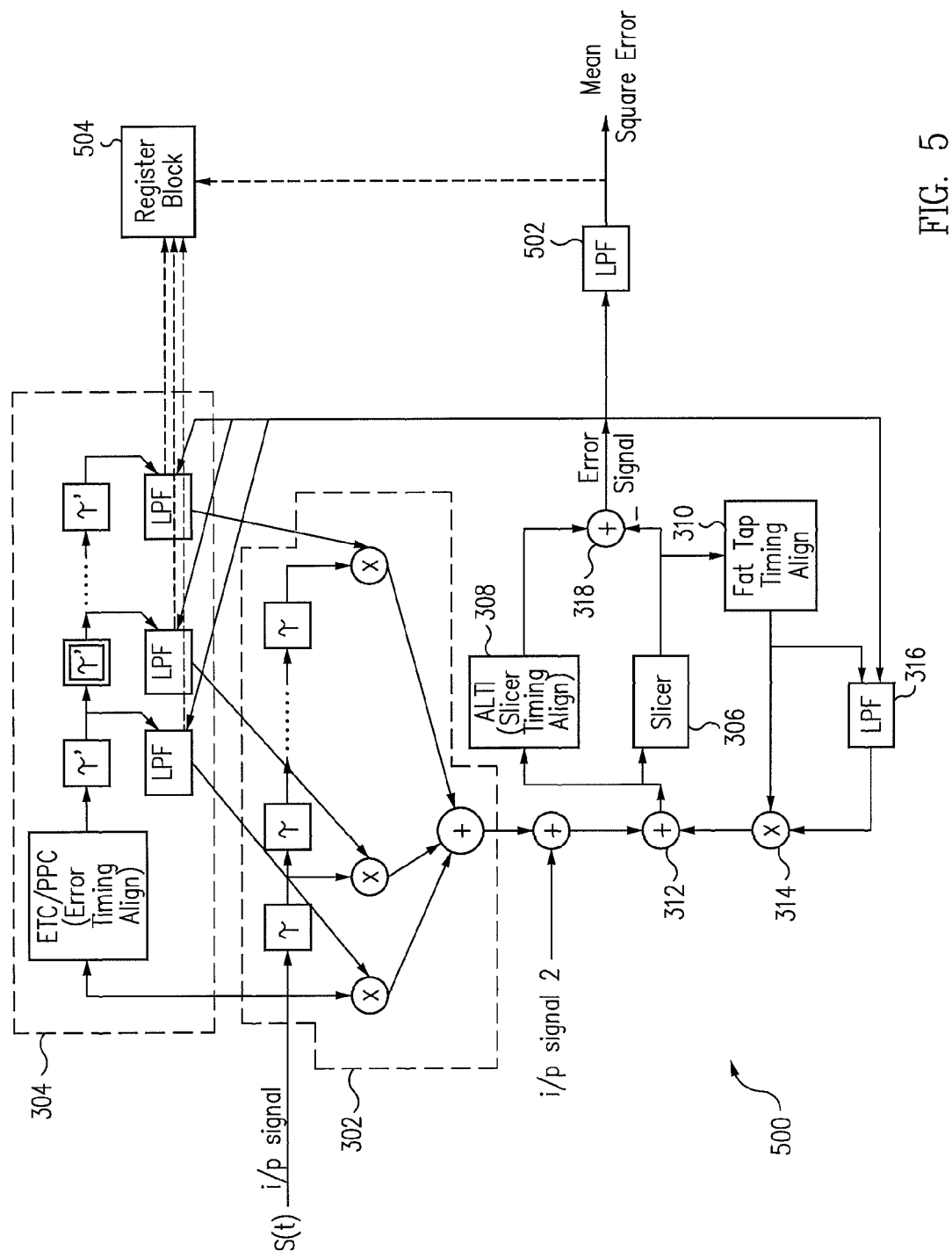
FIG. 5 shows an exemplary application for one or more delay elements in accordance with an embodiment of the present invention.

FIG. 5 illustrates another exemplary implementation of delay elements (e.g., delay elements 100 and/or 200) within an equalizer 500. Equalizer 500 is similar to equalizer 300 and therefore, the general description will not be repeated. As shown, delay elements 100 may be implemented in various functional blocks of equalizer 500, such as for example in feedforward filter 302 and adaptive coefficient generator 304 (i.e., delay element 100 inserted for each τ or τ' circuit element shown in FIG. 5).

Equalizer 500 may be employed as a fractionally-spaced linear equalizer with decision feedback to provide a continuous-time adaptation for a communication channel or a network. The error signal may be filtered by a low pass filter 502 to provide an output signal that indicates a mean square error of the error signal e(t). A register block 504 may be utilized to store the tap coefficients from adaptive coefficient generator 304 and also store various other tap coefficient values, the output signal from low pass filter 502 (i.e., the mean square error of the error signal e(t)), and/or other desired information. The information stored by register block 504 may, for example, be utilized by a processor (e.g., a microprocessor, microcontroller, or other type of logic device) to monitor a communication channel and determine its performance (as described in further detail in U.S. patent application Ser. No. 10/614,587).

Figure 6:
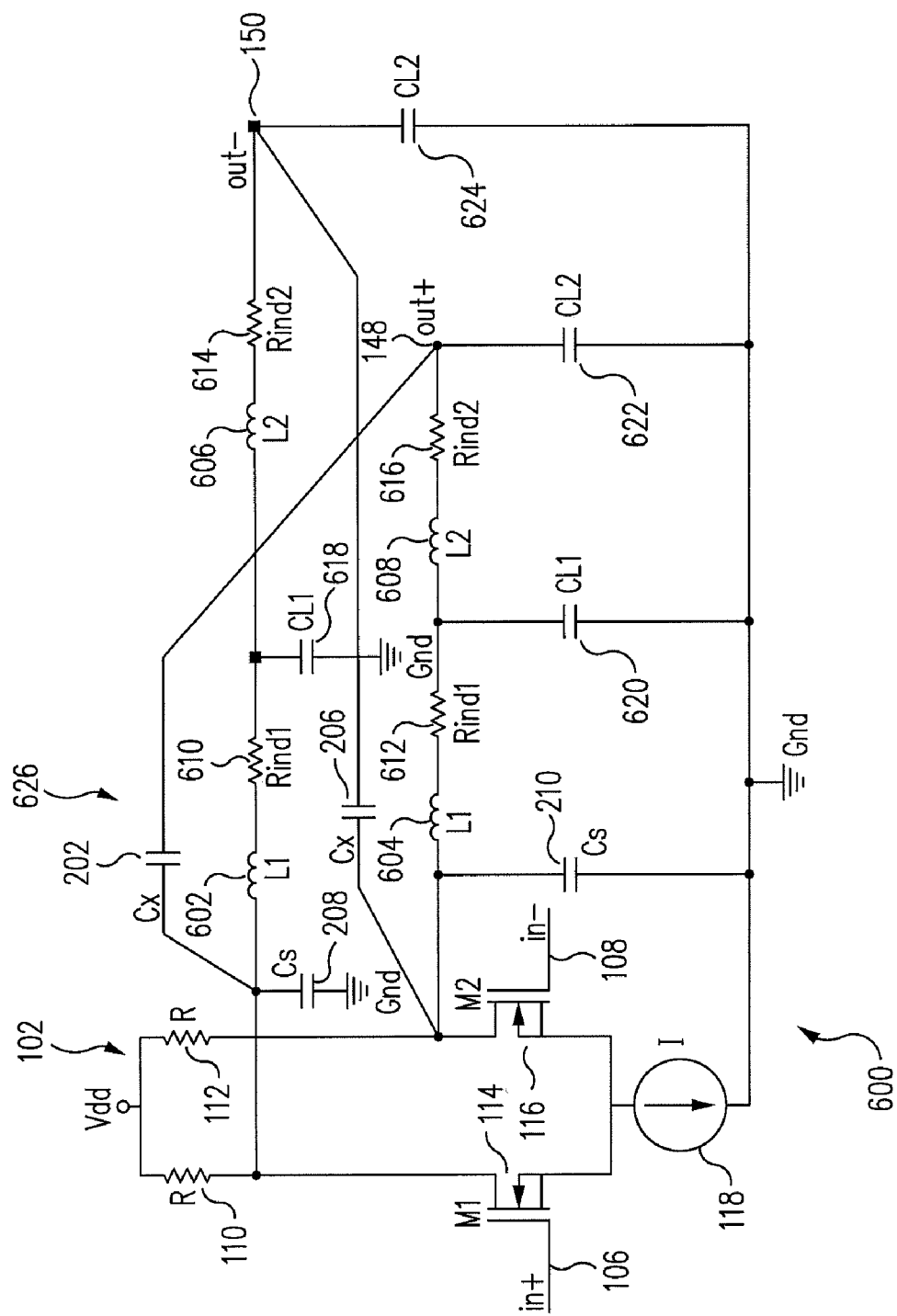
FIG. 6 shows a circuit diagram illustrating a delay element in accordance with an embodiment of the present invention.

FIG. 6 shows a circuit diagram illustrating a delay element 600 in accordance with an embodiment of the present invention. Delay element 600 is similar to delay elements 100 and 200 and therefore, the discussion for similar circuit elements will not be repeated. Delay element 600 may be utilized instead of delay element 100, for example, to provide a longer delay while providing approximately the same bandwidth.

Delay element 600 includes amplifier 102 and a filter 626 having inductors 602 through 608, resistors 610 through 616, and capacitors 202, 206, and 618 through 624. Resistors 610 through 616 represent a resistance associated with inductors 602 through 608, respectively. Capacitors 618 through 624 independently may be fixed or have a variable capacitance. For example, capacitor 618, 620, 622, and 624 may each represent a fixed capacitor in parallel with one or more selectively enabled capacitors (such as illustrated by capacitors 120 and 122 of FIG. 1).

In general, delay element 600 is similar to delay elements 100 and 200 and may be employed and implemented in a similar fashion as described herein for delay elements 100 and 200. For example, delay element 600 may be implemented as a process-insensitive, wide-bandwidth analog delay element (e.g., delay element 600 may be implemented within equalizers 300 or 500 in a similar fashion as described for delay elements 100 and 200).

In accordance with one or more embodiments of the present invention, systems and methods are disclosed for providing wide-bandwidth (broadband), analog delay elements. A delay element using the techniques disclosed herein may maintain an optimally-flat magnitude and group delay response over process variations. A delay element may be used in isolation or as part of a cascade of delay elements, such as for example for a portion of a tunable, analog front-end filter/equalizer.

A delay element may provide a more efficient use of area by providing quasi-distributed structures (e.g., lumped LC circuits) as opposed to fully-distributed conventional designs (e.g., transmission line based delay elements). Furthermore, a delay element may consume less power than some conventional delay elements due to the delay element utilizing an amplifier only as an active core followed by a passive filter.

Embodiments described above illustrate but do not limit the invention. It should also be understood that numerous modifications and variations are possible in accordance with the principles of the present invention. Accordingly, the scope of the invention is defined only by the following claims.

We claim:

1. An equalizer comprising:
   a feedforward filter adapted to receive a first input signal and provide a first output signal, wherein the feedforward filter comprises at least one delay element having a variable delay;
   an adaptive coefficient generator adapted to receive the first input signal and a second signal and provide tap coefficients to the feedforward filter;
   a slicer adapted to receive a slicer input signal and provide a slicer output signal;
   a slicer timing alignment block adapted to receive the slicer input signal and provide a second output signal, wherein the slicer output signal is subtracted from the second output signal to generate an error signal;
   a tap timing alignment block adapted to receive the slicer output signal and provide a third output signal; and
   a first low pass filter adapted to receive the third output signal and the error signal and provide a fourth output signal, wherein the fourth output signal is multiplied with the third output signal to provide a feedback signal which is added to the first output signal to generate the slicer input signal.

2. The equalizer of claim 1, wherein the delay element comprises:
   a first inductor having a first terminal and a second terminal, the first terminal adapted to receive a first delay element signal and the second terminal providing a first delay element output signal of the delay element;

a second inductor having a third terminal and a fourth terminal, the third terminal adapted to receive a second delay element signal and the fourth terminal providing a second delay element output signal of the delay element;

a first capacitor coupled between the first terminal of the first inductor and the fourth terminal of the second inductor, wherein a capacitance of the first capacitor is variable; and a second capacitor coupled between the third terminal of the second inductor and the second terminal of the first inductor, wherein a capacitance of the second capacitor is variable.

3. The equalizer of claim 2, wherein the delay element further comprises an amplifier adapted to receive input signals and provide the first delay element signal to the first inductor and the second delay element signal to the second inductor.

4. The equalizer of claim 3, wherein the first and second capacitors each comprises:

a first fixed capacitor;

at least one selectable fifth capacitor coupled in parallel with the first fixed capacitor; and a first transistor in series with each selectable fifth capacitor and adapted to be controlled to determine whether the associated selectable fifth capacitor is enabled.

5. The equalizer of claim 3, wherein the delay element further comprises:

a third capacitor coupled between the fourth terminal of the second inductor and a reference terminal, wherein a capacitance of the third capacitor is variable; and a fourth capacitor coupled between the second terminal of the first inductor and the reference terminal, wherein a capacitance of the fourth capacitor is variable.

6. The equalizer of claim 5, wherein the third and fourth capacitors each comprises:

a second fixed capacitor;

at least one selectable sixth capacitor coupled in parallel with the second fixed capacitor; and a second transistor in series with each selectable sixth capacitor and adapted to be controlled to determine whether the associated selectable sixth capacitor is enabled.

7. The equalizer of claim 1, wherein the adaptive coefficient generator and/or the slicer timing alignment block comprises at least one delay element having a variable delay.

8. The equalizer of claim 1, wherein the delay element comprises:

an amplifier adapted to receive input signals and provide a first delay element signal and a second delay element signal;

a first and a second inductor in series, wherein the first inductor receives the first delay element signal at a first terminal and the second inductor provides a first delay element output signal at a second terminal;

a first capacitor coupled between the first and second inductor and a reference terminal;

a third and a fourth inductor in series, wherein the third inductor receives the second delay element signal at a third terminal and the fourth inductor provides a second delay element output signal at a fourth terminal;

a second capacitor coupled between the third and fourth inductor and the reference terminal;

a third capacitor coupled to the first terminal and the fourth terminal;

a fourth capacitor coupled to the third terminal and the second terminal;

a fifth capacitor coupled to the second terminal and the reference terminal; and a sixth capacitor coupled to the fourth terminal and the reference terminal.

9. The equalizer of claim 8, wherein the third, fourth, fifth, and sixth capacitors are adapted to have a variable capacitance.

10. An equalizer comprising:

means for filtering a first input signal to provide a first output signal, wherein the filtering means includes at least one delay element having a variable delay;

means for providing tap coefficients to the filtering means, wherein the providing means receives the first input signal and an error signal;

means for providing a slicer output signal based on the first output signal and a feedback signal;

means for providing a slicer input time-align output signal based on the first output signal and the feedback signal, wherein the slicer output signal is subtracted from the slicer time-align output signal to provide the error signal;

means for providing a slicer output time-align output signal based on the slicer output signal and the error signal; and means for providing the feedback signal based on the slicer output time-align output signal and the error signal.

11. The equalizer of claim 10, wherein the tap coefficients providing means and the slicer input time-align output signal providing means include at least one delay element having a variable delay.

12. The equalizer of claim 11, wherein the delay element comprises:

an amplifier adapted to receive input signals;

a filter coupled to the amplifier and adapted to provide first and second output signals based on the input signals and having a variable delay, wherein the filter comprises:

a first inductor having a first terminal and a second terminal, the first terminal coupled to a first output terminal of the amplifier and the second terminal providing the first output signal of the delay element;

a second inductor having a third terminal and a fourth terminal, the third terminal coupled to a second output terminal of the amplifier and the fourth terminal providing the second output signal of the delay element;

at least a first capacitor coupled between the first output terminal of the amplifier and the fourth terminal of the second inductor, wherein a capacitance of the at least first capacitor is variable; and at least a second capacitor coupled between the second output terminal of the amplifier and the second terminal of the first inductor, wherein a capacitance of the at least second capacitor is variable.

13. The equalizer of claim 10, wherein the delay element comprises:

an amplifier adapted to receive input signals;

a filter coupled to the amplifier and adapted to provide first and second output signals based on the input signals and having a variable delay, wherein the filter comprises:

a first inductor having a first terminal and a second terminal, the first terminal coupled to a first output terminal of the amplifier and the second terminal providing the first output signal of the delay element;

a second inductor having a third terminal and a fourth terminal, the third terminal coupled to a second output terminal of the amplifier and the fourth terminal providing the second output signal of the delay element;

at least a first capacitor coupled between the first output terminal of the amplifier and the fourth terminal of the second inductor, wherein a capacitance of the at least first capacitor is variable; and at least a second capacitor coupled between the second output terminal of the amplifier and the second terminal of the first inductor, wherein a capacitance of the at least second capacitor is variable.

14. The equalizer of claim 13, wherein the filter further comprises:

at least a third capacitor coupled between the fourth terminal of the second inductor and a reference terminal, wherein a capacitance of the at least third capacitor is variable; and at least a fourth capacitor coupled between the second terminal of the first inductor and the reference terminal, wherein a capacitance of the at least fourth capacitor is variable.

15. The equalizer of claim 14, wherein the amplifier is a differential amplifier comprising:

a pair of transistors;

a pair of resistors coupled between a supply voltage and corresponding ones of the transistors; and a current source coupled between the pair of transistors and the reference terminal.

16. The equalizer of claim 13, wherein the first and second inductors each comprises a pair of inductors in series.

17. A method of equalizing a signal, the method comprising:

filtering a first input signal to provide a first output signal, wherein the filtering uses at least one delay element comprising inductors and cross-coupled capacitors whose capacitance is variable to provide a variable delay;

providing tap coefficients to the filtering, wherein the providing receives the first input signal and an error signal;

providing a slicer output signal based on the first output signal and a feedback signal;

providing a slicer input time-align output signal based on the first output signal and the feedback signal, wherein the slicer output signal is subtracted from the slicer time-align output signal to provide the error signal;

providing a slicer output time-align output signal based on the slicer output signal and the error signal; and providing the feedback signal based on the slicer output time-align output signal and the error signal.

18. The method of claim 17, wherein the capacitance of the cross-coupled capacitors is variable to account for semiconductor processing variations, and wherein the delay element is an allpass filter adapted to provide an approximately constant group delay and magnitude response over a frequency range.

19. The method of claim 17, wherein the delay element further comprises load capacitors whose capacitance is variable.

20. The method of claim 17, wherein the providing of the tap coefficients uses at least one delay element comprising inductors and cross-coupled capacitors whose capacitance is variable to provide a variable delay.

* * * * *